United States Patent
Smith et al.

(10) Patent No.: US 9,373,464 B2
(45) Date of Patent: Jun. 21, 2016

(54) KEYSWITCH, KEYBOARD AND RELATED FORCE FEEDBACK METHOD

(71) Applicants: DARFON ELECTRONICS (SUZHOU) CO., LTD., Suzhou, Jiangsu Province (CN); DARFON ELECTRONICS CORP., Taoyuan (TW)

(72) Inventors: Shana Shiang-Fong Smith, Taoyuan (TW); Chien-Min Wu, Taoyuan (TW); Huang-Hsiao Kao, Taoyuan (TW); Chih-An Wang, Taoyuan (TW); Fei-Ya Chen, Taoyuan (TW)

(73) Assignees: DARFON ELECTRONICS (SUZHOU) CO., LTD., New District, Suzhou, Jiangsu Province (CN); DARFON ELECTRONICS CORP., Gueishan, Taoyuan (TW)

( * ) Notice: Subject to any disclaimer, the term of this patent is extended or adjusted under 35 U.S.C. 154(b) by 219 days.

(21) Appl. No.: 14/337,254

(22) Filed: Jul. 22, 2014

(65) Prior Publication Data

US 2015/0027869 A1    Jan. 29, 2015

(30) Foreign Application Priority Data

Jul. 24, 2013   (TW) .............................. 102126541 A (51) Int. Cl.
*H01H 13/85* (2006.01)
*H01H 3/00* (2006.01)
(Continued)

(52) U.S. Cl.
CPC ............... *H01H 13/85* (2013.01); *G06F 3/016* (2013.01); *G06F 3/0202* (2013.01); *G08B 6/00* (2013.01);
(Continued)

(58) Field of Classification Search
CPC ....... G06F 3/016; G06F 1/1626; G06F 3/041; G06F 2203/04105; G06F 1/16; G06F 1/1616; G06F 1/1643; G06F 1/1654; G06F 2200/1637; G06F 2203/013; G06F 2203/014; G06F 2203/04809; G06F 3/0202; G06F 3/04886; G06F 3/1423; G06F 3/1454; H01H 13/85; H01H 2215/052; H01H 2003/008; H01H 3/12; H01H 13/50; G10H 2210/201; H03K 17/9622; H03K 17/964; H03K 2217/96054; H03K 2217/96062; H04M 2250/22
USPC ........................... 340/407.2, 691.1, 174, 173
See application file for complete search history.

(56) References Cited

U.S. PATENT DOCUMENTS 5,081,898 A *  1/1992  Fujimori .................. G10H 1/02
                                                          84/602
8,482,517 B1 *  7/2013  O'Keeffe ................. G06F 3/033
                                                          345/156

(Continued)

FOREIGN PATENT DOCUMENTS

TW        201040806      11/2010
TW        M410913         9/2011
TW        M413168 U1     10/2011

*Primary Examiner* — Fekadeselassie Girma
(74) *Attorney, Agent, or Firm* — Winston Hsu; Scott Margo (57) ABSTRACT

A keyswitch with force feedback function includes a vibrating source, a switching circuit and a controller. The vibrating source is connected to a cap of the keyswitch. The switching circuit is switched on according to states of the keyswitch. The controller is electrically connected to the vibrating source and the switching circuit. When the switching circuit is switched on, the controller outputs a first driving signal to the vibrating source, and the vibrating source transmits a pressing vibration to the cap of the keyswitch. A period of the first driving signal is smaller than or equal to a predetermined period, a user can feel vibration of the keyswitch due to the pressing vibration.

23 Claims, 6 Drawing Sheets

(51) Int. Cl.
*G08B 6/00* (2006.01)
*H03K 17/96* (2006.01)
*G06F 3/01* (2006.01)
*G06F 3/02* (2006.01)

(52) U.S. Cl.
CPC ........ *H03K 17/964* (2013.01); *H01H 2003/008* (2013.01); *H01H 2215/052* (2013.01); *H03K 2217/96062* (2013.01)

(56) References Cited

U.S. PATENT DOCUMENTS

| | | | |
|---|---|---|---|
| 8,631,490 B2 * | 1/2014 | Wurster | G06F 21/75 345/173 |
| 2007/0284154 A1 * | 12/2007 | Li | H04M 1/23 178/18.03 |
| 2008/0245213 A1 * | 10/2008 | Izumisawa | G10H 1/0575 84/604 |
| 2010/0156824 A1 * | 6/2010 | Paleczny | G06F 3/016 345/173 |
| 2010/0156843 A1 * | 6/2010 | Paleczny | G06F 3/016 345/174 |
| 2010/0156844 A1 * | 6/2010 | Paleczny | G06F 3/016 345/174 |
| 2011/0053577 A1 * | 3/2011 | Lee | H04M 1/72552 455/418 |
| 2011/0148608 A1 * | 6/2011 | Grant | G06F 1/1626 340/407.2 |
| 2011/0157052 A1 * | 6/2011 | Lee | G06F 1/1626 345/173 |
| 2012/0075198 A1 * | 3/2012 | Sulem | G06F 3/016 345/173 |
| 2013/0024590 A1 * | 1/2013 | Zhao | G06F 1/1616 710/300 |
| 2013/0076686 A1 * | 3/2013 | Kono | G06F 3/0416 345/173 |
| 2013/0212677 A1 * | 8/2013 | Wurster | G06F 21/83 726/22 |
| 2013/0212678 A1 * | 8/2013 | Wurster | G06F 21/75 726/22 |
| 2014/0082490 A1 * | 3/2014 | Jung | G06F 3/016 715/702 |
| 2015/0027869 A1 * | 1/2015 | Smith | H01H 13/85 200/5 A |
| 2015/0034471 A1 * | 2/2015 | Smith | H01H 13/85 200/5 A |
| 2015/0122621 A1 * | 5/2015 | Fukumoto | H03K 17/9622 200/5 A |
| 2016/0070349 A1 * | 3/2016 | Marrs | G06F 3/016 345/173 |

* cited by examiner

KEYSWITCH, KEYBOARD AND RELATED FORCE FEEDBACK METHOD

BACKGROUND OF THE INVENTION

1. Field of the Invention

The present invention relates to a keyswitch and a keyboard, and more particularly, to a keyswitch with a force feedback function, a keyboard with the force feedback function and a related force feedback method.

2. Description of the Prior Art

Height of the keyboard is decreased with a trend of the thin-typed keyboard, and the conventional mechanical keyboard with large stroke does not conform to the thin-typed design. The existing thin-typed keyboard uses the touch keyswitch or the small-stroke keyswitch to decrease structural thickness of the keyboard. The small-stroke keyswitch and the touch keyswitch cannot provide force feedback during operation, and the user is difficult to ensure whether pressing manipulation is completed or not. Another conventional keyboard with the force feedback function includes a vibrator to transmit the vibratile wave to the corresponding keyswitch. The structural thickness of the keyboard equals a height amount of the keyswitch and the vibrator, and does not conform to the trend of the thin-typed keyboard.

SUMMARY OF THE INVENTION

The present invention provides a keyswitch with a force feedback function, a keyboard with the force feedback function and a related force feedback method for solving above drawbacks.

According to the claimed invention, a force feedback method applied to a keyswitch includes step of (a) triggering a vibration source to output a pressing vibration to the keyswitch when the keyswitch is changed from a released status to a pressed status, the pressing vibration continues for a sustain period, and the sustain period is smaller than or equal to a predetermined period. The force feedback method further includes step of (b) detecting a status of the keyswitch in response to an expiration of the predetermined period. Step (a) is executed when the keyswitch is already released; step (c) is executed when the keyswitch is still pressed. The force feedback method further includes step of (c) outputting a releasing vibration to the keyswitch by the vibration source when the keyswitch is changed from the pressed status to the released status.

According to the claimed invention, a keyswitch with a force feedback function includes a vibration source, a switch circuit and a controller. The vibration source is coupled to the keyswitch. The switch circuit is selectively switched ON or OFF according to a status of the keyswitch. The controller is electrically coupled to the switch circuit and the vibration source. The switch circuit is switched ON to trigger the controller to output a first driving signal to the vibration source, the first driving signal drives the vibration source to output a pressing vibration to the keyswitch. The first driving signal continues for a sustain period, and the sustain period is smaller than or equal to a predetermined period. When the switch circuit is already switched OFF before expiration of the predetermined period, the controller does not output any driving signal to the vibration source in response to the switch circuit switched from ON to OFF. When the switch circuit is still switched ON at the expiration of the predetermined period, the controller detects whether the switch circuit is switched from ON to OFF. The controller further outputs a second driving signal to the vibration source in response to the switch circuit switched from ON to OFF, the second driving signal drives the vibration source to output a releasing vibration to the keyswitch.

According to the claimed invention, a force feedback method applied to a keyswitch includes step of (a) outputting a pressing vibration to the keyswitch by a vibration source, and triggering a time-counter to increase a cumulative pressing time, when the keyswitch is changed from a release status to a pressed status. The force feedback method further includes step of (b) triggering the time-counter to stop increase of the cumulative pressing time when the keyswitch is changed from the pressed status to the released status. When the cumulative pressing time is smaller than a predetermined period, reset the cumulative pressing time and go to step (a). When the cumulative pressing time is greater than or equal to the predetermined period, reset the cumulative pressing time and go to step (c). The force feedback method further includes step of (c) outputting a releasing vibration to the keyswitch by the vibration source and go to step (a).

According to the claimed invention, a keyboard with a force feedback function includes a vibration source, a switch circuit, a controller and a time-counter. The vibration source is connected to the keyswitch. The switch circuit is selectively switched ON or OFF according to a status of the keyswitch. The controller is electrically coupled to the switch circuit and the vibration source. The time-counter is electrically coupled to the controller. The controller is triggered to output a first driving signal to the vibration source and the time-counter is triggered to increase a cumulative pressing time when the switch circuit is switched from OFF to ON. The first driving signal drives the vibration source to output a pressing vibration to the keyswitch. The time-counter is triggered to stop increase of the cumulative pressing time when the switch circuit is switched from ON to OFF. Further, when the cumulative pressing time is smaller than a predetermined period, the controller does not output any driving signal to the vibration source in response to the switch circuit switched OFF from ON. When the cumulative pressing time is greater than or equal to the predetermined period, the controller outputs a second driving signal to the vibration source, and the second driving signal drives the vibration source to output a releasing vibration to the keyswitch.

The keyswitch and the keyboard with the force feedback function and the force feedback method of the present invention utilize the switch circuit to detect whether the keyswitch is pressed. The controller can transmit the pressing vibration to the keyswitch when the keyswitch is just pressed, so the user can feel the vibration feedback from the keyswitch. The controller further can determine whether the releasing vibration is outputted to the keyswitch according to the sustain period of the pressing vibration or the first driving signal when the keyswitch is released. As the click speed of the keyswitch is fast, the keyswitch provides the pressing vibration without other feedback; as the click speed of the keyswitch is slow, the keyswitch provides the pressing vibration and the releasing vibration respectively during the pressing and releasing procedures, so that the user can feel two-stage vibrations to simulate perceptibly force feedback of the real mechanical keyboard.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
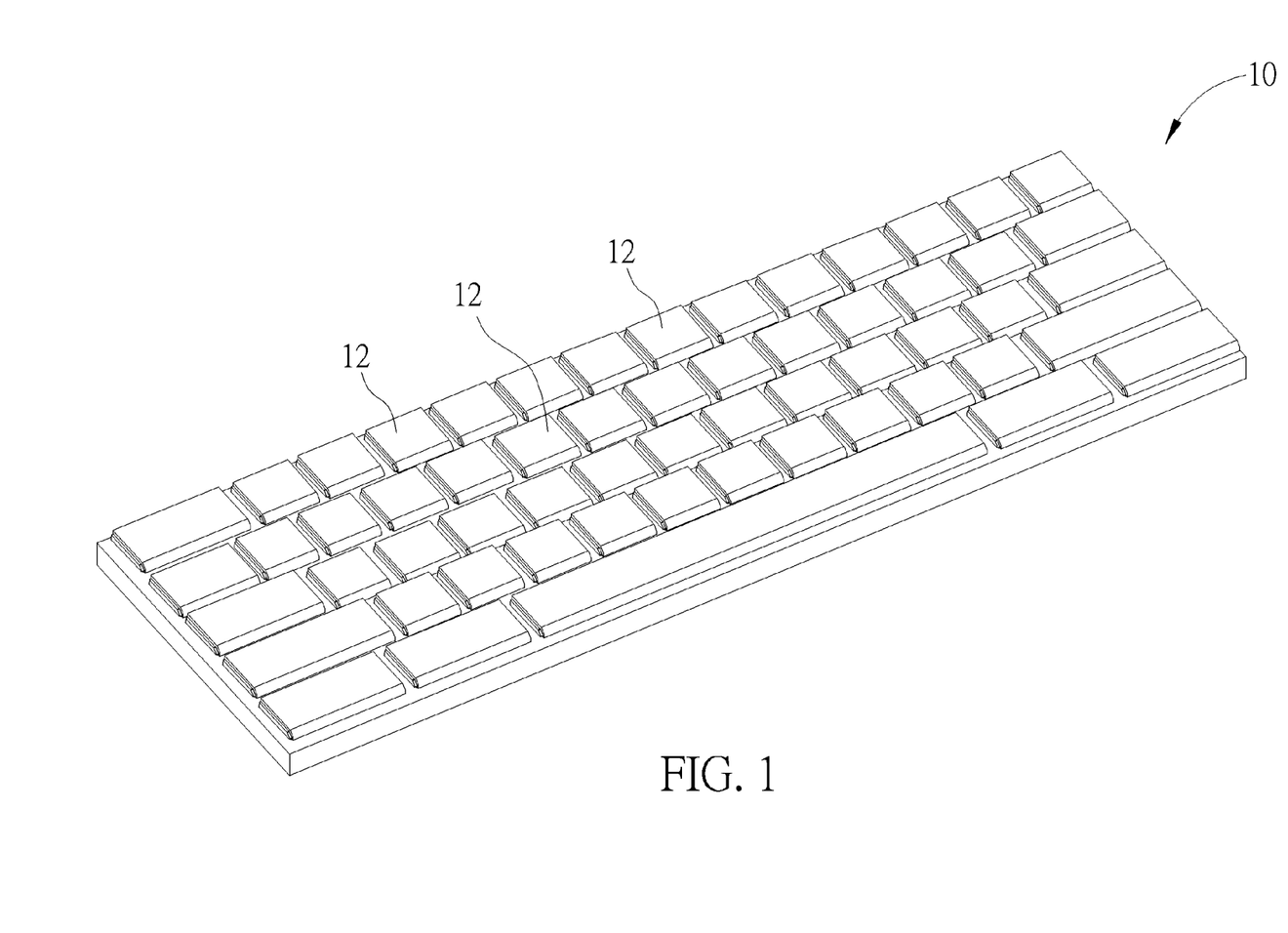
FIG. 1 is a diagram of a keyboard according to an embodiment of the present invention.
Figure 2:
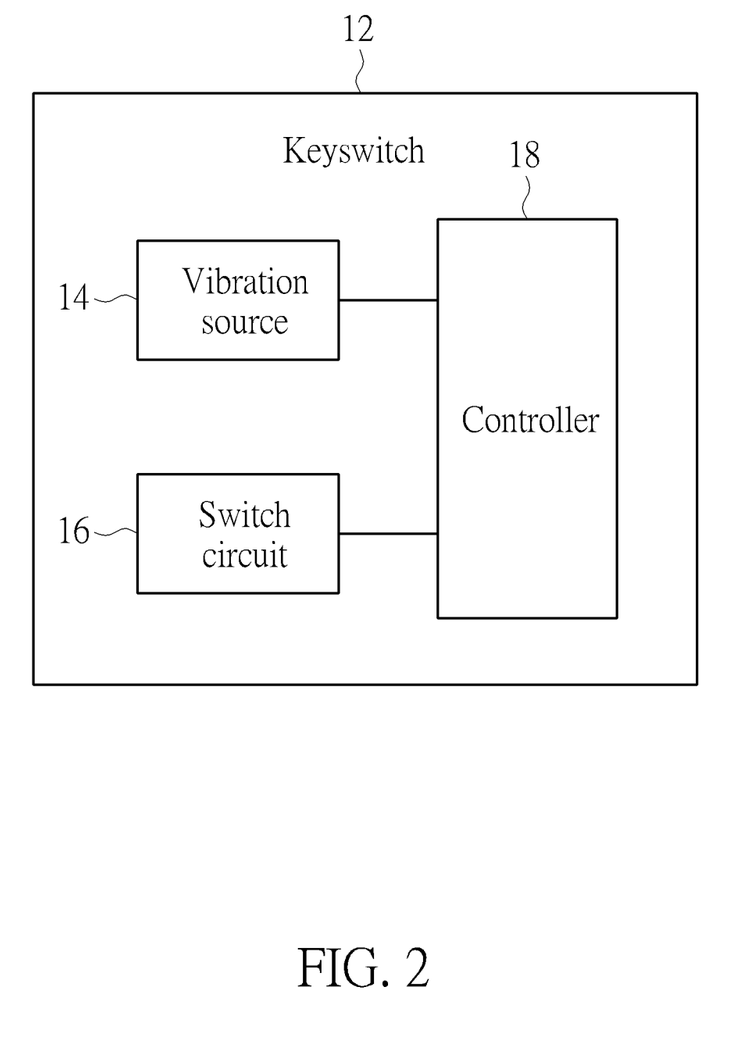
FIG. 2 is a functional block diagram of a keyswitch according to the embodiment of the present invention.

Please refer to FIG. 1. FIG. 1 is a diagram of a keyboard 10 according to an embodiment of the present invention. The keyboard 10 includes a plurality of keyswitches 12. Each of the keyswitches 12 represents an individual character. A cumulative pressing time increases when the keyswitch 12 is continuously pressed, the keyswitch outputs a corresponding character signal once whenever the cumulative pressing time increases for an additional time unit (such as N seconds). Please refer to FIG. 2. FIG. 2 is a functional block diagram of the keyswitch 12 according to the embodiment of the present invention. The keyswitch 12 includes a vibration source 14, a switch circuit 16 and a controller 18. Each of the keyswitches 12 may have an own vibration source 14, which means an amount of the keyswitch 12 conforms to an amount of the vibration source 14. Further, the keyboard 10 can include one vibration source 14 coupled to the plurality of keyswitches 12 to provide respective vibratile signals. The controller 18 is electrically coupled to the switch circuit 16 and the vibration source 14, to receive a command from the switch circuit 16 so as to drive the vibration source 14. The switch circuit 16 has an on status (ON) and an off status (OFF). According to a status of at least one of the keyswitches 12, the switch circuit 16 can be selectively and alternatively situated at the on status or the off status. The switch circuit 16 can be switched on to trigger the controller 18 to actuate the vibration source 14; meanwhile, the keyswitch 12 is sensibly vibrated by a vibratile wave from the vibration source 14, and the user's finger touches the vibrating keyswitch 12 to obtain preferred operational feeling.

Figure 3:
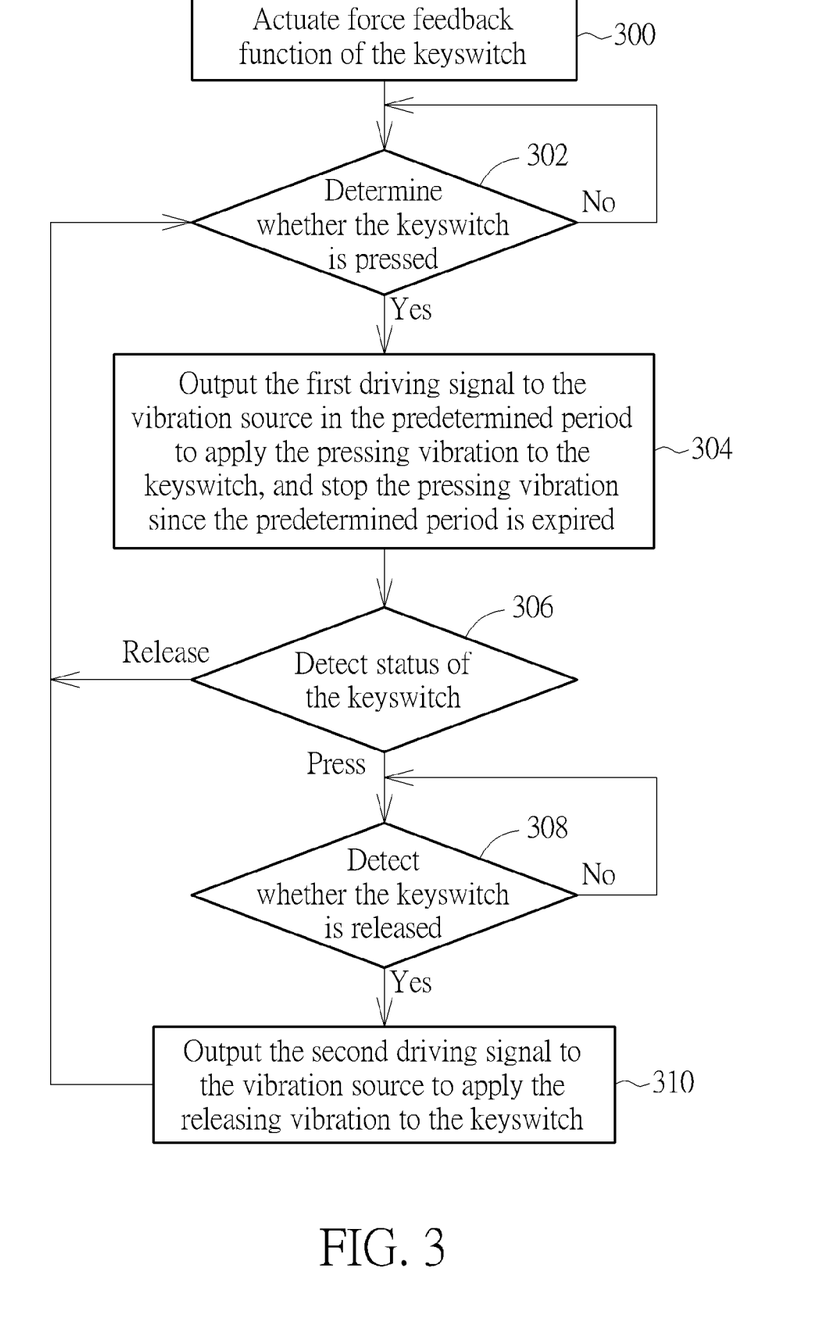
FIG. 3 is a flow chart of a force feedback method applied to the keyswitch according to a first embodiment of the present invention.
Figure 4:
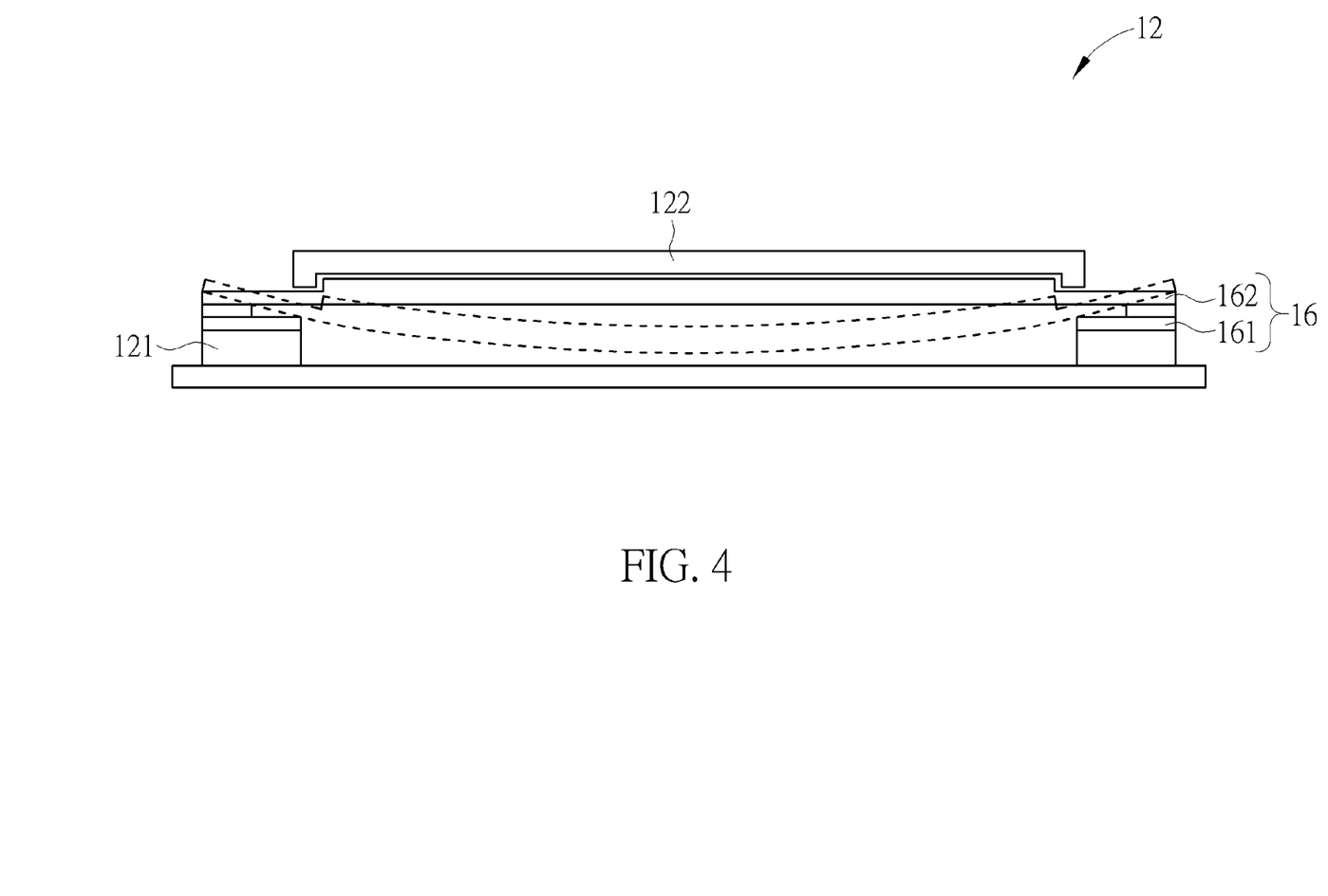
FIG. 4 is a structural diagram of the keyswitch according to the embodiment of the present invention.

Please refer to FIG. 3. FIG. 3 is a flow chart of a force feedback method applied to the keyswitch 12 according to a first embodiment of the present invention. The force feedback method shown in FIG. 3 is suitable for the keyboard 10 and the keyswitch 12 shown in FIG. 1. Please refer to FIG. 4. FIG. 4 is a structural diagram of the keyswitch 12 according to the embodiment of the present invention. The switch circuit 16 can be an assembly of a sensor 161 and a piezoelectric buzzer 162. The sensor 161 is disposed one a bottom 121 of the keyswitch 12. The piezoelectric buzzer 162 is disposed under a keycap 122 of the keyswitch 12. When the keyswitch 12 is changed from a released status to a pressed status, the piezoelectric buzzer 162 is deformed by descendant pressure of the keyswitch 12 and contacts the sensor 161 to switch on the switch circuit 16, as a dotted lined shown in FIG. 4. When an external force applied to the keyswitch 12 is removed, the piezoelectric buzzer 162 is recovered to an initial status with a movement of the keyswitch 12, the piezoelectric buzzer 162 is separated from the sensor 161, and the switch circuit 16 is switched off to be situated at the off status. Components of the switch circuit 16 are not limited to the above-mentioned embodiment, and depend on actual demand.

As shown in FIG. 3, step 300 is firstably executed to actuate a force feedback function of the keyboard 10. Step 302 is executed and the controller 18 determines whether the keyswitch 12 is changed to the pressed status according to modes of the switch circuit 16 accordingly under the foresaid keyswitch 12. When there is no force applied to the keyswitch 12, the keyswitch 12 originally is in the released status, and the controller 18 keeps detection of the keyswitch 12 to determine whether the keyswitch 12 is changed to the pressed status. When the switch circuit 16 under the keyswitch 12 is switched from OFF to ON, the controller 18 determines that the keyswitch 12 is changed to the pressed status, and step 304 is executed to output a first driving signal to the vibration source 14 by the controller 18. The first driving signal drives the vibration source 14 to output a pressing vibration to the corresponding keyswitch 12. The first driving signal continues for a sustain period, and the sustain period can be smaller than or equal to a predetermined period. The user touches the keyswitch 12 to feel the pressing vibration generated by the first driving signal in the predetermined period. The controller 18 does not output the first driving signal to the vibration source 14 and the pressing vibration is vanished. Step 306 is executed that the controller 18 detects the status of the keyswitch 12 in response to an expiration of the predetermined period (i.e., detects the status of keyswitch 12 at the moment when the predetermined period is expired), so as to determine whether a second-stage vibration feedback is actuated according to user's operation.

In step 306, the keyswitch 12 is changed from the pressed status to the released status to make the switch circuit 16 switched OFF before expiration of the predetermined period, which means the cumulative pressing time of the keyswitch 12 is smaller than the predetermined period, and an external force applied to the keyswitch is removed before the pressing vibration is vanished or within a short time after the pressing vibration is vanished. When the switch circuit 16 is already switched OFF before expiration of the predetermined period, the controller 18 does not output any driving signal to the vibration source 14 in response to the switch circuit 16 switched from ON to OFF, and the keyswitch 12 does not actuate the second-stage vibration feedback (the feedback during release of the keyswitch 12). After, step 302 is executed to detect the next operational status of the keyswitch 12.

On the other hand, when the keyswitch 12 is still pressed to make the switch circuit 16 still ON at the moment of expiration of the predetermined period, the step 308 is executed to detect whether the switch circuit 16 is switched from ON to OFF so as to determine whether the keyswitch 12 is changed to the released status. When the controller 18 detects that the keyswitch 12 is not released, the external force applied to the keyswitch 12 is not removed, the controller 18 keeps status detection of the keyswitch 12, and the keyswitch 12 continuously outputs the corresponding character signal. When the controller 18 detects that the switch circuit 16 is switched off, the user's finger may touch the corresponding keyswitch 12 yet and starts to be removed from the corresponding keyswitch 12. In the meantime, step 310 is executed that the controller 18 outputs a second driving signal to the vibration source 14 in response to the switch circuit 16 switched from ON to OFF, the second driving signal drives the vibration source 14 to output a releasing vibration to the corresponding keyswitch 12, and the keyswitch 12 is sensibly vibrated by feedback of the releasing vibration when the user's finger leaves from the keyswitch 12. Step 302 is further executed after the controller 18 outputs the second driving signal, so as to proceed with next operational detection of the keyswitch 12.

Figure 5:
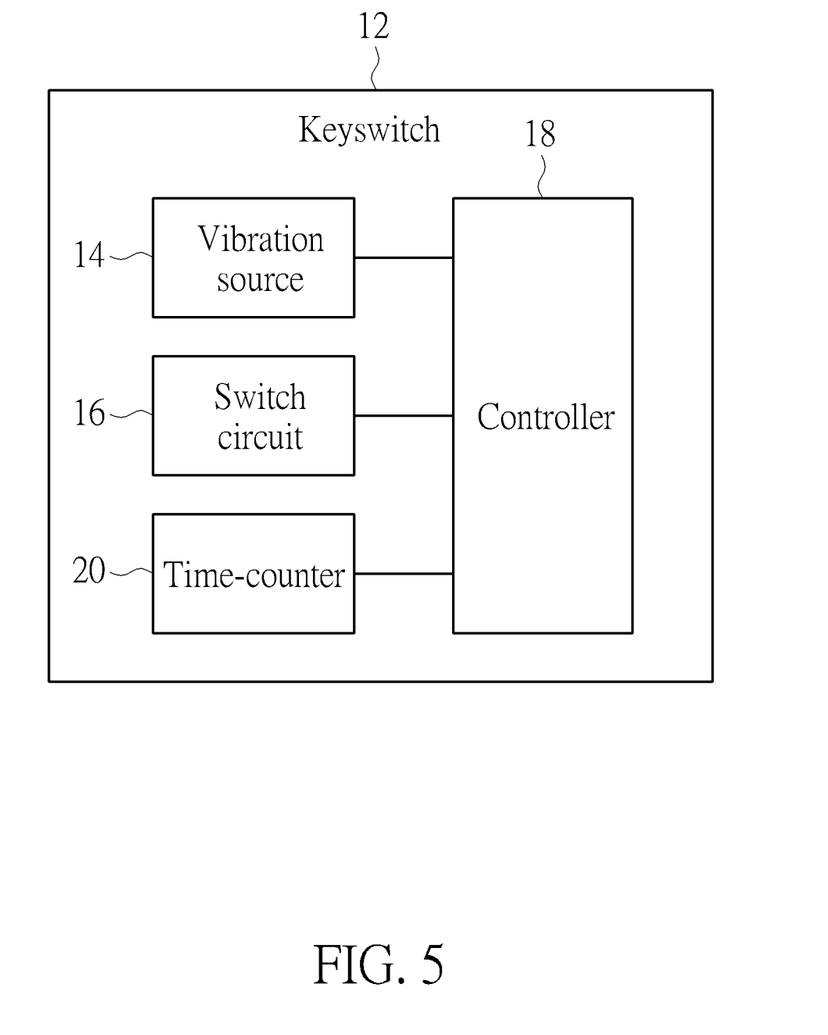
FIG. 5 is a functional block diagram of the keyswitch according to another embodiment of the present invention.

Please refer to FIG. 5. FIG. 5 is a functional block diagram of the keyswitch 12 according to another embodiment of the present invention. In this embodiment, elements having the same numeral as ones of the above-mentioned embodiment have the same structures and functions, and a detailed description is omitted herein for simplicity. The keyswitch 12 of this embodiment includes a time-counter 20 electrically coupled to the controller 18. The time-counter 20 is utilized to count the cumulative pressing time, and the controller 18 compares the cumulative pressing time with the predetermined period. As the cumulative pressing time is smaller than the predetermined period, click speed of the keyswitch 12 is fast, the controller 18 does not output any driving signal to the vibration source 14 when the switch circuit 16 is switched from ON to OFF, and the keyswitch 12 only provides feedback of the pressing vibration. As the cumulative pressing time is greater than or equal to the predetermined period, click schedule of the keyswitch 12 is longer (which means the slow click speed), the controller 18 drives the vibration source 14 when the switch circuit 16 is detected to be switched off from the on status, and the keyswitch 12 provides feedback of the pressing vibration during keyswitch pressing procedure and further provides feedback of the releasing vibration during keyswitch releasing procedure.

Figure 6:
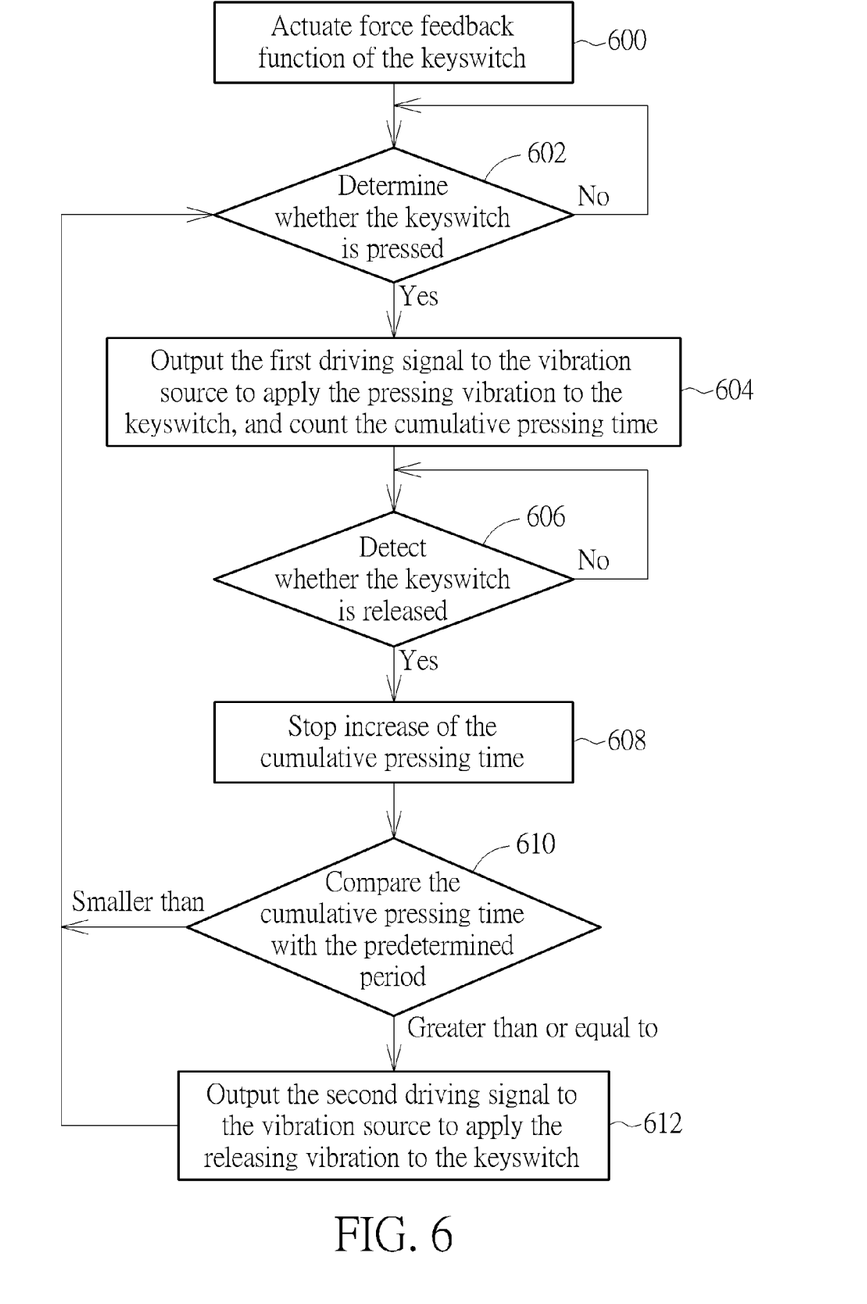
FIG. 6 is a flow chart of a force feedback method applied to the keyswitch according to a second embodiment of the present invention.

Please refer to FIG. 6. FIG. 6 is a flow chart of a force feedback method applied to the keyswitch 12 according to a second embodiment of the present invention. The force feedback method shown in FIG. 6 is suitable for the keyswitch 12 shown in FIG. 5. Step 600 and step 602 are executed to actuate the force feedback function of the keyswitch 12 and then to utilize the switch circuit 16 for determining whether the keyswitch 12 is changed to the pressed status by the controller 18. When the switch circuit 16 is situated at the off status, the keyswitch 12 is not pressed, and the controller 18 keeps detection of the modes of the switch circuit 16. When the switch circuit 16 is switched on from the off status, the keyswitch 12 is changed to the pressed status, step 604 is executed to output the first driving signal to the vibration source 14 and to trigger the time-counter 20 to increase the cumulative pressing time by the controller 18. The first driving signal drives the vibration source 14 to output the pressing vibration to the keyswitch 12, and the keyswitch 12 is sensibly vibrated by vibration feedback.

Step 606 is executed and the controller 18 utilizes the switch circuit 16 to determine whether the keyswitch 12 is changed to the released status. The keyswitch 12 is not released when the switch circuit 16 is situated at the on status, and the controller 18 keeps detection of the keyswitch 12. Further, the keyswitch 12 is changed to the released status when the switch circuit 16 is switched from ON to OFF, step 608 is executed and the controller 18 triggers the time-counter 20 to stop increase of the cumulative pressing time. Then, step 610 is executed to compare the cumulative pressing time with the predetermined period. When the cumulative pressing time is smaller than the predetermined period, reset the cumulative pressing time, the click speed of the keyswitch 12 is fast, the keyswitch 12 does not generate feedback of the releasing vibration, step 602 is executed and the controller 18 determines whether the keyswitch 12 is changed to the pressed status. When the cumulative pressing time is greater than or equal to the predetermined period, reset the cumulative pressing time, step 612 is executed to output the second driving signal to the vibration source 14 by the controller 18. The second driving signal drives the vibration source 14 to output the releasing vibration to the keyswitch 12, and the keyswitch 12 is sensibly vibrated by the vibration feedback. After that, step 602 is executed to proceed with the next operational detection of the keyswitch 12.

It should be mentioned that an execution period of the vibration source 14 for outputting the pressing vibration or the releasing vibration is substantially between 10-200 milliseconds, and more particularly, to be preferably constrained between 25-35 milliseconds. The pressing vibration and the releasing vibration respectively can be a sine wave, a square wave or a wave with any form. The wave with any form represents an arithmetic sum of a non-periodic wave and a periodic wave with a frequency lower than 500 Hz by multiplication, addition or subtraction. Any vibratile wave capable of applying the vibration feedback to the keyswitch is suitable to the pressing vibration and the releasing vibration of the present invention, and a detailed description is omitted herein for simplicity.

In conclusion, the keyswitch and the keyboard with the force feedback function and the force feedback method of the present invention utilize the switch circuit to detect whether the keyswitch is changed to the pressed status. The controller can transmit the pressing vibration to the keyswitch when the keyswitch is just pressed, so the user can feel the vibration feedback from the keyswitch. The controller further can determine whether the releasing vibration is outputted to the keyswitch according to the sustain period of the pressing vibration or the first driving signal when the keyswitch is changed to the released status. As the click speed of the keyswitch is fast, the keyswitch provides the pressing vibration without other feedback; as the click speed of the keyswitch is slow, the keyswitch provides the pressing vibration and the releasing vibration respectively during the pressing and releasing procedures, so that the user can feel two-stage vibrations to simulate perceptibly force feedback of the real mechanical keyboard.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A force feedback method applied to a keyswitch, comprising:
   (a) triggering a vibration source to output a pressing vibration to the keyswitch when the keyswitch is changed from a released status to a pressed status, the pressing vibration continues for a sustain period, and the sustain period is smaller than or equal to a predetermined period;
   (b) detecting a status of the keyswitch in response to an expiration of the predetermined period:
      (b1) back to step (a) when the keyswitch is already released;
      (b2) go to step (c) when the keyswitch is still pressed; and
   (c) outputting a releasing vibration to the keyswitch by the vibration source when the keyswitch is changed from the pressed status to the released status.

2. The force feedback method of claim 1, wherein the keyswitch comprises a switch circuit, the force feedback method utilizes the switch circuit to determine the state of the keyswitch.

3. The force feedback method of claim 2, wherein the keyswitch is changed to the pressed status when the switch circuit is switched on, and the keyswitch is changed to the released status when the switch circuit is switched off.

4. The force feedback method of claim 2, wherein the keyswitch further comprises a controller electrically connected to the switch circuit and the vibration source, the force feedback method utilizes the controller to immediately drive the vibration source to output the pressing vibration when the switch circuit is switched from OFF to ON.

5. The force feedback method of claim 1, wherein a cumulative pressing time increases when the keyswitch is continuously pressed, the keyswitch outputs a corresponding character signal once whenever the cumulative pressing time increases for an additional time unit.

6. The force feedback method of claim 1, wherein the sustain period for the pressing vibration or the releasing vibration is substantially between 10-200 milliseconds.

7. The force feedback method of claim 1, wherein the pressing vibration and the releasing vibration respectively are a sine wave, a square wave or a wave with any form, and the wave with any form is an arithmetic sum of a non-periodic wave and a periodic wave with a frequency lower than 500 Hz by multiplication, addition or subtraction.

8. A keyswitch with a force feedback function, comprising:
a vibration source coupled to the keyswitch;
a switch circuit selectively switched ON or OFF according to a status of the keyswitch; and
a controller electrically coupled to the switch circuit and the vibration source, wherein the switch circuit is switched ON to trigger the controller to output a first driving signal to the vibration source, the first driving signal drives the vibration source to output a pressing vibration to the keyswitch, the first driving signal continues for a sustain period, and the sustain period is smaller than or equal to a predetermined period;
wherein when the switch circuit is already switched OFF before expiration of the predetermined period, the controller does not output any driving signal to the vibration source in response to the switch circuit switched from ON to OFF;
wherein when the switch circuit is still switched ON at the expiration of the predetermined period, the controller detects whether the switch circuit is switched from ON to OFF, the controller further outputs a second driving signal to the vibration source in response to the switch circuit switched from ON to OFF, the second driving signal drives the vibration source to output a releasing vibration to the keyswitch.

9. The keyswitch of claim 8, wherein a cumulative pressing time increases when the keyswitch is continuously pressed, the keyswitch outputs a corresponding character signal once whenever the cumulative pressing time increases for an additional time unit.

10. The keyswitch of claim 8, wherein the sustain period for the pressing vibration or the releasing vibration is substantially between 10-200 milliseconds.

11. The keyswitch of claim 8, wherein the pressing vibration and the releasing vibration respectively are a sine wave, a square wave or a wave with any form, and the wave with any form is an arithmetic sum of a non-periodic wave and a periodic wave with a frequency lower than 500 Hz by multiplication, addition or subtraction.

12. A keyboard with a force feedback function, comprising:
a plurality of keyswitches;
a vibration source coupled to the plurality of keyswitches;
a switch circuit selectively switched ON or OFF according to a status of at least one of the keyswitches; and
a controller electrically coupled to the switch circuit and the vibration source, wherein the switch circuit is switched ON to trigger the controller to output a first driving signal to the vibration source, the first driving signal drives the vibration source to output a pressing vibration to the at least one keyswitch, the first driving signal continues for a sustain period, and the sustain period is smaller than or equal to a predetermined period;
wherein when the switch circuit is already switched OFF before expiration of the predetermined period, the controller does not output any driving signal to the vibration source in response to the switch circuit switched from ON to OFF;
wherein when the switch circuit is still switched ON at the expiration of the predetermined period, the controller detects whether the switch circuit is switched from ON to OFF, the controller further outputs a second driving signal to the vibration source in response to the switch circuit switched from ON to OFF, the second driving signal drives the vibration source to output a releasing vibration to the at least one keyswitch.

13. A force feedback method applied to a keyswitch, comprising:
(a) outputting a pressing vibration to the keyswitch by a vibration source, and triggering a time-counter to increase a cumulative pressing time, when the keyswitch is changed from a release status to a pressed status;
(b) triggering the time-counter to stop increase of the cumulative pressing time when the keyswitch is changed from the pressed status to the released status:
(b1) when the cumulative pressing time is smaller than a predetermined period, reset the cumulative pressing time and go to step (a);
(b2) when the cumulative pressing time is greater than or equal to the predetermined period, reset the cumulative pressing time and go to step (c); and
(c) outputting a releasing vibration to the keyswitch by the vibration source and go to step (a).

14. The force feedback method of claim 13, wherein the keyswitch comprises a switch circuit, the force feedback method utilizes the switch circuit to determine the released status and the pressed status of the keyswitch.

15. The force feedback method of claim 14, wherein the keyswitch further comprises a controller electrically coupled to the switch circuit, the vibration source and the time-counter, the force feedback method determines that the keyswitch is pressed when the switch circuit is switched from OFF to ON, and utilizes the controller to immediately drive the vibration source to output the pressing vibration.

16. The force feedback method of claim 13, wherein the cumulative pressing time increases when the keyswitch is continuously pressed, the keyswitch outputs a corresponding character signal once whenever the cumulative pressing time increases for an additional time unit.

17. The force feedback method of claim 13, wherein the sustain period of the pressing vibration or the releasing vibration is substantially between 10-200 milliseconds.

18. The force feedback method of claim 13, wherein the pressing vibration and the releasing vibration respectively are a sine wave, a square wave or a wave with any form, and the wave with any form is an arithmetic sum of a non-periodic wave and a periodic wave with a frequency lower than 500 Hz by multiplication, addition or subtraction.

19. A keyboard with a force feedback function, comprising:
a vibration source connected to the keyswitch;
a switch circuit selectively switched ON or OFF according to a status of the keyswitch;

a controller electrically coupled to the switch circuit and the vibration source; and a time-counter electrically coupled to the controller;

wherein the controller is triggered to output a first driving signal to the vibration source and the time-counter is triggered to increase a cumulative pressing time when the switch circuit is switched from OFF to ON, the first driving signal drives the vibration source to output a pressing vibration to the keyswitch;

wherein the time-counter is triggered to stop increase of the cumulative pressing time when the switch circuit is switched from ON to OFF, and
  (1) when the cumulative pressing time is smaller than a predetermined period, the controller does not output any driving signal to the vibration source in response to the switch circuit switched OFF from ON;
  (2) when the cumulative pressing time is greater than or equal to the predetermined period, the controller outputs a second driving signal to the vibration source, and the second driving signal drives the vibration source to output a releasing vibration to the keyswitch.

20. The force feedback method of claim 19, wherein the cumulative pressing time increases when the keyswitch is continuously pressed, the keyswitch outputs a corresponding character signal once whenever the cumulative pressing time increases for an additional time unit.

21. The force feedback method of claim 19, wherein the sustain period of the pressing vibration or the releasing vibration is substantially between 10-200 milliseconds.

22. The force feedback method of claim 19, wherein the pressing vibration and the releasing vibration respectively are a sine wave, a square wave or a wave with any form, and the wave with any form is an arithmetic sum of a non-periodic wave and a periodic wave with a frequency lower than 500 Hz by multiplication, addition or subtraction.

23. A keyboard with a force feedback function, comprising:

a plurality of keyswitches;

a vibration source coupled to the plurality of keyswitches;

a switch circuit selectively switched ON or OFF according to a status of at least one of the keyswitches; and a controller electrically coupled to the switch circuit and the vibration source; and a time-counter electrically coupled to the controller;

wherein the controller is triggered to output a first driving signal to the vibration source and the time-counter is triggered to increase a cumulative pressing time when the switch circuit is switched from OFF to ON, the first driving signal drives the vibration source to output a pressing vibration to the at least one keyswitch;

wherein the time-counter is triggered to stop increase of the cumulative pressing time when the switch circuit is switched from ON to OFF, and
  (1) when the cumulative pressing time is smaller than a predetermined period, the controller does not output any driving signal to the vibration source in response to the switch circuit switched OFF from ON;
  (2) when the cumulative pressing time is greater than or equal to the predetermined period, the controller outputs a second driving signal to the vibration source, and the second driving signal drives the vibration source to output a releasing vibration to the at least one keyswitch.

* * * * *